US009444023B2

United States Patent
Tsai (10) Patent No.: US 9,444,023 B2
(45) Date of Patent: Sep. 13, 2016

(54) PHOSPHOR SHEET AND LIGHT EMITTING DEVICE CONTAINING THE SAME

(71) Applicant: EDISON OPTO CORPORATION, New Taipei (TW)

(72) Inventor: Shang-Hsun Tsai, New Taipei (TW)

(73) Assignee: Edison Opto Corporation, New Taipei (TW)

(*) Notice: Subject to any disclaimer, the term of this patent is extended or adjusted under 35 U.S.C. 154(b) by 0 days.

(21) Appl. No.: 14/622,055

(22) Filed: Feb. 13, 2015

(65) Prior Publication Data

US 2016/0218250 A1   Jul. 28, 2016

(30) Foreign Application Priority Data

Jan. 26, 2015   (TW) .............................. 104102485 A (51) Int. Cl.

| H01L 33/50 | (2010.01) |
|---|---|
| H01L 33/52 | (2010.01) |
| H01L 33/58 | (2010.01) |
| H01L 33/44 | (2010.01) |
| C09K 11/02 | (2006.01) |

(Continued)

(52) U.S. Cl.
CPC ........... *H01L 33/502* (2013.01); *C09K 11/025* (2013.01); *H01L 33/44* (2013.01); *H01L 33/505* (2013.01); *H01L 33/508* (2013.01); *H01L 33/58* (2013.01)

(58) Field of Classification Search
CPC ..... H01L 33/44; H01L 33/58; H01L 33/502; H01L 33/505; H01L 33/508; C09K 11/025
USPC ............... 257/88, 89, 98, 99, 100, E33.049, 257/E33.059, E33.072, E33.074; 438/26, 438/27, 28, 29; 313/486, 512
See application file for complete search history.

(56) References Cited

U.S. PATENT DOCUMENTS

| 8,519,426 B2 * | 8/2013 | Lee ........................ H01L 33/486 257/100 |
| 2007/0269586 A1 * | 11/2007 | Leatherdale ............ H01L 33/58 427/66 |
| 2012/0122255 A1 * | 5/2012 | Shylo ...................... H01L 33/56 438/27 |

(Continued)

Primary Examiner — Dao H Nguyen
(74) Attorney, Agent, or Firm — Winston Hsu; Scott Margo (57) ABSTRACT

The phosphor sheet of the present invention mainly includes a sheet material that is formed by mixing and solidifying of a phosphor powder and an adhesive material. The sheet material subsequently forms a first surface that receives a light source, and forms a second surface that is located on the opposite side to the first surface for scattering a light source. In addition, the distribution ratio of the phosphor powder as well as the adhesive material within the phosphor sheet is based mainly on the different positions and different distances towards the light source; the distribution ratio of the phosphor powder and the adhesive material increases gradually from the first surface towards the second surface. The phosphor of the present invention is designed to be a sheet material, so as to enable the overall volume of the light emitting device to be reduced. Moreover, distribution ratio of the phosphor powder that is within the phosphor sheet is based on the different positions and different distances towards the light source; and the concentration of the phosphor powder increases gradually from the positions that are closest to the light source to the positions that are furthest away from the light source, so as to prevent the part of highly concentration of phosphor powder within the phosphor sheet coming in direct contact with the light emitting heat source, and thereby causing the deterioration of the phosphor sheet. This may then enables the life span of the light emitting device to be increased.

16 Claims, 6 Drawing Sheets

(56) References Cited

U.S. PATENT DOCUMENTS

2015/0137163 A1* 5/2015 Harris .................. H01L 33/483 257/98

2015/0171288 A1* 6/2015 Shindo .................. H01L 33/501 257/98

2015/0318453 A1* 11/2015 Hung .................... H01L 33/508 257/98

* cited by examiner

PHOSPHOR SHEET AND LIGHT EMITTING DEVICE CONTAINING THE SAME

CROSS-REFERENCE TO RELATED APPLICATIONS

This Application claims priority to, Taiwanese Patent Application No. 104102485, filed Jan. 26, 2015, the contents of which are incorporated herein by reference for all purposes.

FIELD OF THE INVENTION

The present invention relates generally to a phosphor that is used in the field of light emission, and more particularly, the present invention relates to a phosphor sheet that has phosphor powder within it, and the concentration of the phosphor powder within the phosphor sheet has a gradually increasing or decreasing distribution based on the different positions and different distances towards the light source.

BACKGROUND OF THE INVENTION

Figure 1:
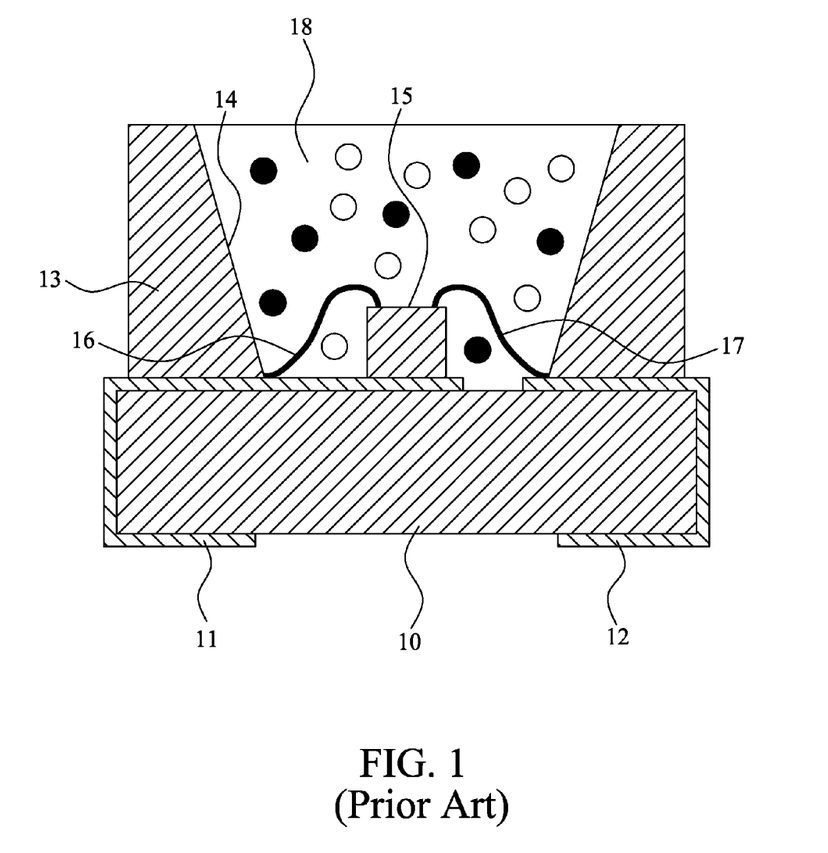
FIG. 1 is a cross-sectional schematic diagram showing a conventional light emitting device.

As shown in FIG. 1, a traditional light emitting device mainly includes a substrate 10, a first circuit pattern 11 and a second circuit pattern 12 that are formed on the surface of the substrate 10. A reflective mask 13 that is formed in the recess portion (a reflective mask 13 that forms a recess portion 14) exists on top of the first circuit pattern 11 and the second circuit pattern 12 of the traditional light emitting device. In addition, a light emitting diode device 15 that is in connection with the two conductive wires 16, 17 also exists on top of the first circuit pattern 11, whereby the conductive wire 16 is in connection with the light emitting diode device 15 and the first circuit pattern; and the other conductive wire 17 is in connection with the light emitting diode device 15 and the second circuit pattern. Furthermore, a resin material 18 that contains a phosphor and a diffusion agent exists in the interior of the recess portion 14.

However, due to the fact that such light emitting devices contain a phosphor and resin material, and that these may be in direct contact with the light emitting diode device, and as such during light illumination, the light emitting device produces heat and thus causing the deterioration of the phosphor; this may cause the wavelength of the phosphor to change, together with decreased efficiency. This eventually causes the life span of the light emitting device to decrease. In addition to this, the distribution of the phosphor and the diffusion agent within the resin material cannot be accurately controlled, leading to the color that is emitted by the light emitting device to be non-uniform, occurring as a result of the non-uniform changes of the wavelengths.

Figure 2:
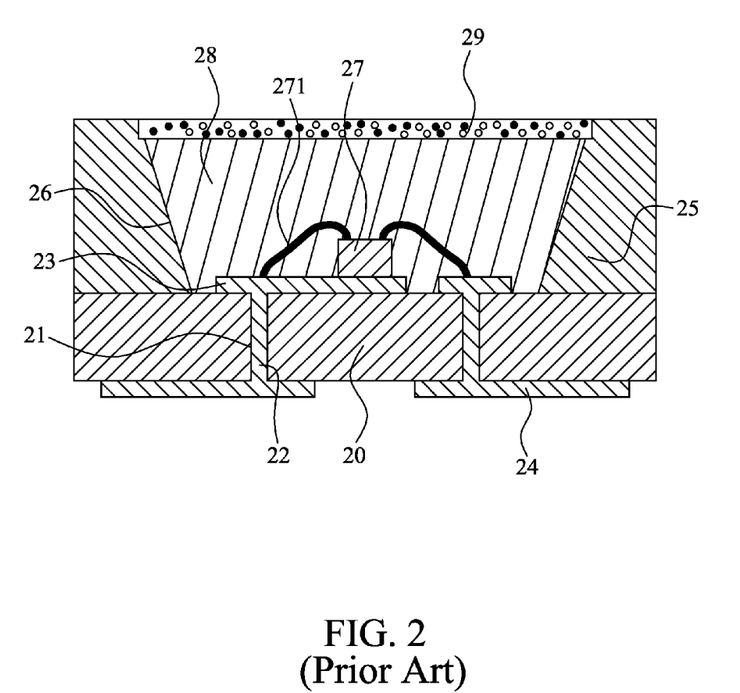
FIG. 2 is a cross-sectional schematic diagram showing a different conventional light emitting device.

In view of the above drawbacks, FIG. 2 shows a different type of light emitting device that includes a mounting substrate 20, whereby the mounting substrate has a plurality of through holes 21, and a first wiring pattern 23 and a second wiring 24 that are in connection with the through hole pattern 22, respectively, exist on the upper surface and lower surface of this light emitting device of the prior art. The outer periphery of the upper surface of the mounting substrate 20 also includes a reflective container 25 of the accommodating space, in order to enable the light emitting diode device 27 to be assembled within the accommodating space 26; and the light emitting diode device 27 is in connection with the first wiring pattern 23, by means of the conductive wire 271. In addition, the interior of the accommodating space 26 is filled with resin material 28, and a phosphor plate 29 that may be able to change the wavelengths is assembled at the top portion of the accommodating space 26.

This type of light emitting device insulates the phosphor plate by means of the resin material. Although this type of light emitting device may be able to prevent the damage caused to the phosphor plate as a result of the heat produced by the light emitting diode device, however, the presence of the extra resin material and the reflective mask usually significantly increases the volume of the light emitting device.

SUMMARY OF THE INVENTION

The main objective of the present invention is to reduce the overall volume of the light emitting device, by means of designing a phosphor sheet that is within the light emitting device as a sheet material. In addition, the distribution of the phosphor powder within the phosphor sheet may be based on the different positions and different distances towards the light source. The concentration of the phosphor powder increases gradually from the positions that are closest to the light source to the positions that are furthest away from the light source, so as to prevent the part of highly concentration of the phosphor powder within the phosphor sheet to come in direct contact with the light emitting source, and thus causing the deterioration of the phosphor sheet. The design of the present invention allows the life span of the light emitting device to be increased.

The other objective of the present invention is to have both a rough surface and a smooth surface on the two surfaces of the phosphor sheet, so as to avoid the phenomenon of light reflection when the light source passes through the phosphor sheet, such that the efficiency of projecting light may be increased.

In order to achieve the aforesaid objectives, the phosphor sheet of the present invention includes a sheet material having a thickness of between 40 µm-200 µm that is formed by the mixing and solidifying of a phosphor powder and an adhesive material, whereby the sheet material may include a first surface that receives a light source and a second surface located on the opposite side to the first surface that scatters a light source. In addition, the first surface may be a smooth surface, and the second surface may be a rough surface.

The main characteristic of the present invention is that the distribution ratio of the phosphor powder that is within the sheet material increases gradually from the first surface towards the second surface, on the basis of the different distances towards the light source. Furthermore, the sheet material of the present invention may be sequentially divided into a first thickness region, a second thickness region and a third thickness region, from the first surface to the second surface; the first thickness region includes a first average concentration A, the second thickness region includes a second average concentration B, and the third thickness region includes a third average concentration C.

In accordance with a preferred exemplary embodiment of the present invention, each of the first thickness region and the third thickness region may occupy 10% of the overall thickness of the sheet material, and the second thickness region may occupy 80% of the overall thickness of the sheet material. Moreover, the difference between the first average concentration A and the third average concentration C may satisfy A/C>50%. Moreover, the average Wt % of the formulation ratio of the mixture between the phosphor powder and the adhesive material may satisfy phosphor powder/adhesive material=20%-300%.

The light emitting device having a phosphor sheet of the present invention may include three parts, and these may be a light emitting diode chip, a phosphor sheet and a diffuser sheet. The light emitting diode chip is to enable a light source to be emitted; the phosphor sheet may be located at the side of the light emitting diode chip that enables the light source to be emitted; whereby the sheet material may be formed by the mixing and solidifying of the phosphor powder and the adhesive material; the sheet material may include a first surface that receives a light source and a second surface located on the opposite side to the first surface that scatters a light source; The distribution ratio of the phosphor powder within the sheet material may increase gradually from the first surface towards the second surface, on the basis of the different distances towards the light source. Moreover, the diffuser sheet may be located at the position of the second surface, and at a side of the phosphor sheet, and may include a receiving surface and a scattering surface; the scattering surface may be a rough surface.

In addition, since the structure of the phosphor sheet that is inside the light emitting device of the present invention is the same as the structure that is within the above-mentioned preferred exemplary embodiments, so it is not described further here. However, the first surface of the light emitting diode chip and the first surface of phosphor sheet of the light emitting device of the present invention may further be mutually fixed by an adhesive material. Moreover, and the second surface of the phosphor sheet and the diffuser sheet may be mutually fixed by a different adhesive material.

The benefit of the present invention is that the distribution of the phosphor powder within the phosphor sheet may be based on the different positions and different distances towards the light source. The concentration of the phosphor powder increases gradually from the positions that are closest to the light source to the positions that are furthest away from the light source, so as to prevent the concentration of the phosphor powder within the phosphor sheet to be too high; and also to prevent the phosphor powder to come in direct contact with the light emitting source, and thus causing the deterioration of the phosphor sheet.

Furthermore, the thickness of the whole phosphor sheet may only be about 40 μm-200 μm, and the assembly of the phosphor sheet within the light emitting device may significantly reduce the volume of the components, and thus effectively reducing the costs of manufacture as well as increasing the competitiveness of the product.

BRIEF DESCRIPTION OF THE DRAWINGS

The present invention can be understood in more detail by reading the subsequent detailed description in conjunction with the examples and preferred exemplary embodiments made to the accompanying drawings, wherein.

DETAILED DESCRIPTION OF THE PREFERRED EMBODIMENT

The accompanying drawings are included to provide a further understanding of the invention, and are incorporated in and constitute a part of this specification. The drawings illustrate the preferred exemplary embodiments of the invention and, together with the description, serve to explain the principles of the invention.

Figure 3:
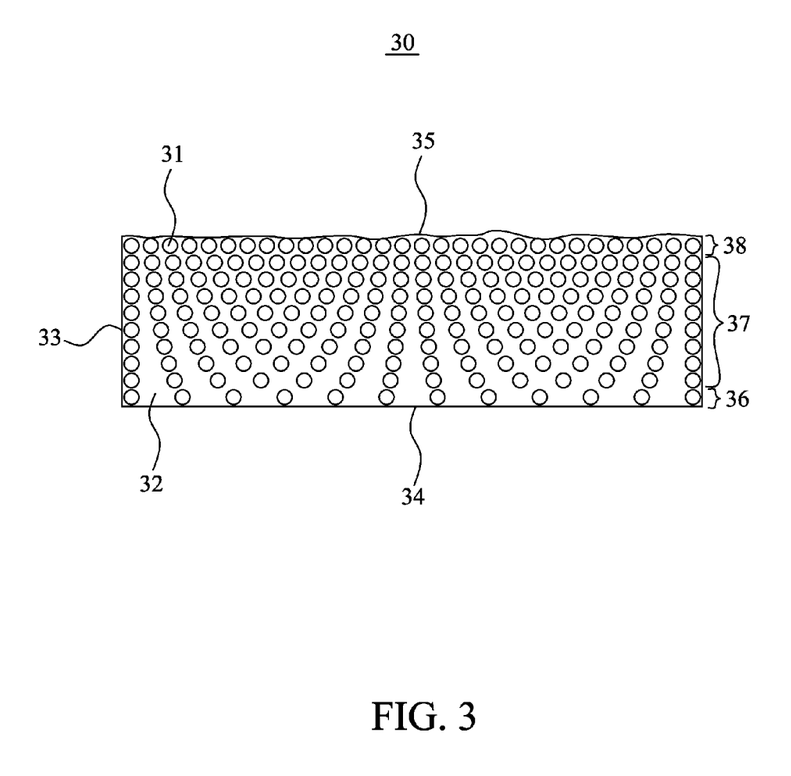
FIG. 3 is a cross-sectional schematic diagram showing a phosphor sheet in accordance with the present invention.

First of all, as shown in FIG. 3 and also in accordance with a preferred embodiment of the present invention, the phosphor sheet 30 of the present invention mainly includes a sheet material 33 that is formed by the mixing of a phosphor powder 31 and an adhesive material 32, before the mixture is subsequently solidified. In accordance with a preferred exemplary embodiment of the present invention, the thickness of the sheet material 33 may be between 40 μm-200 μm. The surface of the sheet material 33 may include a first surface 34 that receives a light source and a second surface 35 that scatters a light source, whereby the second surface 35 may be located on the opposite side of the first surface 34 of the sheet material 33; and whereby the first surface 34 may be a smooth surface, and the second surface 35 may be designed as a rough surface that may enable the phenomenon of light reflection to be avoided.

The distinguishing technical feature of the present invention is that the distribution ratio of the phosphor powder 31 that is within the phosphor sheet 33 may be based on the different positions and different distances towards the light source. As shown in FIG. 3, the concentration of the phosphor powder 31 within the sheet material 33 may increase gradually from the first surface 34 towards the second surface 35. As shown in the FIG. 3, the second surface 35 may have the highest amount of phosphor powder 31, and the closer the position to the first surface 34, the lower the amount of the phosphor powder 31.

In addition, the sheet material 33 of the present invention may be sequentially divided into a first thickness region 36, a second thickness region 37 and a third thickness region 38, from the first surface 34 to the second surface 35. In accordance with a preferred exemplary embodiment of the present invention, the first thickness region 36 may occupy 10% of the overall thickness of the sheet material 33, the second thickness region 37 may occupy 80% of the overall thickness of the sheet material 33, and the third thickness region 38 may occupy the remaining 10% of the overall thickness of the sheet material 33.

Furthermore, as can also be seen in FIG. 3, the increasing distribution of the phosphor powder 31 that is within the first thickness region 36 may be known as a first average concentration A, the increasing distribution of the phosphor powder 31 that is within the second thickness region 37 may be known as a second average concentration B, and the increasing distribution of the phosphor powder 31 that is within the third thickness region 38 may be known as a third average concentration C.

In accordance with a preferred exemplary embodiment of the present invention, the difference between the first average concentration A and the third average concentration C must satisfy the condition of A/C>50%. In addition, the average Wt % of the formulation ratio of the mixture between the phosphor powder 31 and the adhesive material 32 must satisfy the condition of phosphor powder 31/adhesive material 32=20%-300%.

Figure 4:
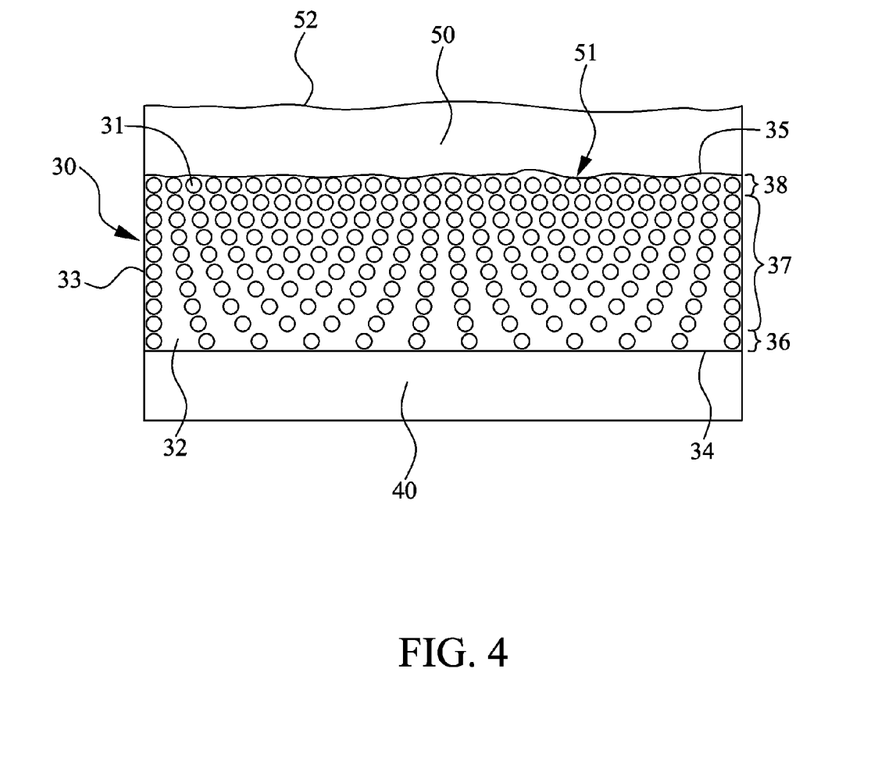
FIG. 4 is a cross-sectional schematic diagram illustrating the light emitting device in accordance with a first preferred exemplary embodiment of the present invention.
Figure 5:
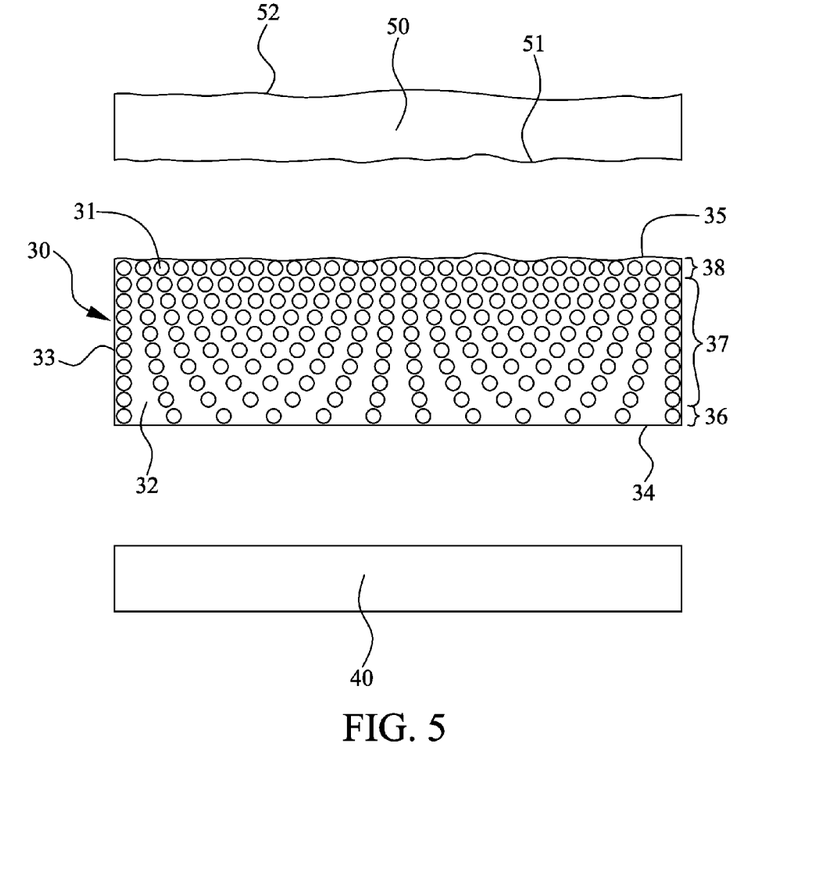
FIG. 5 shows an exploded view of the light emitting device in accordance with the present invention.

As shown in FIG. 4 and FIG. 5, the light emitting device of the present invention may include a light emitting diode chip 40 (LED chip 40) that is assembled sequentially from bottom to top, a phosphor sheet 30 that is adjacent to the light emitting diode chip 40 and the diffuser sheet 50 that is also adjacent to the phosphor sheet 30, whereby after the conduction of electricity, the light emitting diode chip 40 may produce a light source on the light emitting side, whereby the light may be emitted towards the phosphor sheet 30.

Similarly, as can also be seen in FIG. 4 and FIG. 5, the phosphor sheet 30 is formed by the mixing and subsequently solidifying of the phosphor powder 31 and the adhesive material 32, and a sheet material 33 having a thickness of 40 µm-200 µm is formed by the above-mentioned mixing and solidifying. The sheet material 33 may include a first surface 34 that receives a light source and a second surface 35 that is located on the opposite side to the first surface 34 that scatters a light source, whereby the distribution of the phosphor powder 31 that is within the sheet material 33 is based on the different positions and different distances towards the light source. The distribution ratio of the phosphor powder 31 may increase gradually from the first surface 34 to the second surface 35. Moreover, since the structure of the phosphor sheet 30 that is inside the light emitting device of the present invention is the same as the structure that is within the above-mentioned preferred exemplary embodiments, as such it is not described further here.

In accordance with a preferred exemplary embodiment of the present invention, the diffuser sheet 50 may be located on the second surface 35 and on one side of the phosphor sheet 30. The diffuser sheet 50 may include a receiving surface 51 that may be adjacent to the phosphor sheet 30 and a scattering surface 52 for carrying out the treatment of roughening; and similarly, the scattering surface 52 may also be a rough surface for avoiding the phenomenon of light reflection.

Figure 6:
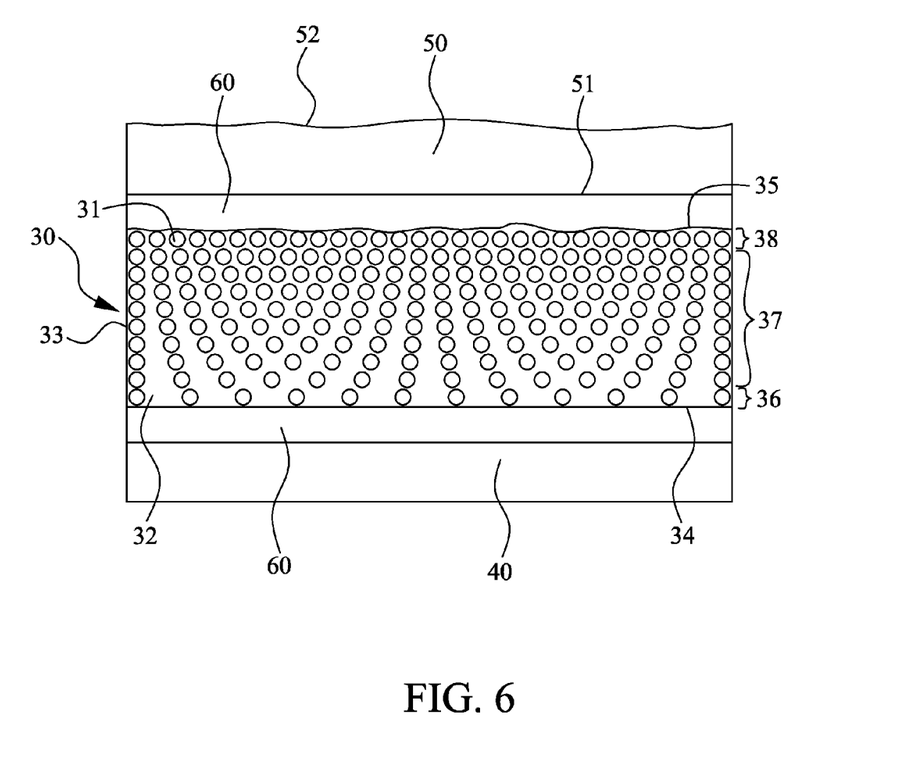
FIG. 6 is a cross-sectional schematic diagram illustrating the light emitting device in accordance with a second preferred exemplary embodiment of the present invention.

As shown in FIG. 6 and in accordance to a preferred exemplary embodiment of the present invention, the light emitting device of the present invention may include four parts, which are a light emitting diode chip 40, a phosphor sheet 30, two adhesive materials 60 as well as a diffuser sheet 50; whereby the structures of the light emitting diode chip 40, the phosphor sheet 30 and the diffuser sheet 50 may be all the same as those of the previous preferred exemplary embodiment of the present invention. However, the only difference lies in the fact that the first surface 34 and the second surface 35 of the phosphor sheet 30 are respectively coated with an adhesive material 60 beforehand, and this may be followed by adhering the adhesive material 60 that is in contact with the first surface 34 to the receiving surface of the light emitting diode chip 40. In addition, the adhesive material 60 that is in contact with the second surface 35 may also be adhered to the receiving surface 51 of the diffuser sheet 50, and subsequent to the solidification of the two adhesive materials 60, the phosphor sheet 30 may be fixed in between the light emitting diode chip 40 and the diffuser sheet 50, by means of the two adhesive materials 60.

Although the preferred exemplary embodiments of the present invention have been described with reference to the preferred exemplary embodiments thereof, it may be apparent to those ordinarily skilled in the art that a variety of modifications and changes may be made without departing from the scope of the present invention which is intended to be defined by the appended claims.

What is claimed is:

1. A light emitting device having a phosphor sheet, the light emitting device comprising:
    a substrate;
    a circuit pattern formed on the substrate;
    a light emitting diode chip disposed on a side of the circuit pattern, which is opposite to the substrate;
    a phosphor sheet formed by a plurality of phosphor powders and an adhesive material, the phosphor sheet is directly in connection with a side of the light emitting diode chip, which is opposite to the circuit pattern,
    wherein an interval width of two of the phosphor powders increases gradually towards the light emitting diode chip.

2. The light emitting device of claim 1, wherein
    the phosphor sheet comprises
        a first surface that connects to the light emitting diode chip and
        a second surface located on an opposite side with respect to the first surface, and
    a distribution ratio of the phosphor powders within the phosphor sheet increases gradually from the first surface towards the second surface, based on different distances towards the light emitting diode chip.

3. The light emitting device of claim 2, wherein the phosphor sheet is sequentially divided into a first thickness region, a second thickness region and a third thickness region, from the first surface to the second surface;
    the first thickness region comprises a first average concentration A, the second thickness region comprises a second average concentration B, and the third thickness region comprises a third average concentration C.

4. The light emitting device of claim 3, wherein the difference between the first average concentration A and the third average concentration C satisfies:

$$A/C > 50\%.$$

5. The light emitting device of claim 3, wherein each of the first thickness region and the third thickness region occupies 10% of the overall thickness of the phosphor sheet, and
    the second thickness region occupies 80% of the overall thickness of the phosphor sheet.

6. The light emitting device of claim 2, wherein the average weight percentage (Wt %) of the mixture between the phosphor powders and the adhesive material satisfies:

$$\text{phosphor powders/adhesive material}=20\%\text{-}300\%.$$

7. The light emitting device of claim 2, wherein the first surface is a smooth surface, and the second surface is a rough surface.

8. A light emitting device having a phosphor sheet, the light emitting device comprising:
    a substrate;
    a circuit pattern formed on the substrate;
    a light emitting diode chip disposed on a side of the circuit pattern, which is opposite to the substrate;
    a phosphor sheet directly connected with the light emitting diode chip, the phosphor sheet is formed by a plurality of phosphor powders and an adhesive material, the phosphor sheet comprising
        a first surface that connects to the light emitting diode chip and
        a second surface located on an opposite side with respect to the first surface;

a diffuser sheet in connection with the second surface of the phosphor sheet, the diffuser sheet comprising a receiving surface, and a scattering surface, wherein a distribution ratio of the phosphor powders within the phosphor sheet increases gradually from the first surface towards the second surface based on different distances towards a light source, and an interval width of two of the phosphor powders within the phosphor sheet increases gradually towards the light emitting diode chip.

9. The light emitting device of claim 8, wherein the phosphor sheet is sequentially divided into a first thickness region, a second thickness region and a third thickness region, from the first surface to the second surface;

the first thickness region comprises a first average concentration A, the second thickness region comprises a second average concentration B, and the third thickness region comprises a third average concentration C.

10. The light emitting device of claim 9, wherein the difference between the first average concentration A and the third average concentration C satisfies:

$$A/C > 50\%.$$

11. The light emitting device of claim 9, wherein each of the first thickness region and the third thickness region occupies 10% of the overall thickness of the phosphor sheet, and the second thickness region occupies 80% of the overall thickness of the phosphor sheet.

12. The light emitting device of claim 8, wherein the average weight percentage (Wt %) of the formulation ratio of the mixture between the phosphor powders and the adhesive material satisfies:

phosphor powders/adhesive material=20%-300%.

13. The light emitting device of claim 8, wherein the thickness of the sheet material is 40 μm-200 μm.

14. The light emitting device of claim 8, wherein the first surface is a smooth surface, and the second surface is a rough surface.

15. The light emitting device of claim 8, wherein the light emitting diode chip and the first surface of phosphor sheet are mutually fixed by an adhesive and the phosphor sheet and the second surface of the diffuser sheet are mutually fixed by another adhesive.

16. The light emitting device of claim 8, wherein the scattering surface of the diffuser sheet is a rough surface.

* * * * *